United States Patent [19]

Suarez et al.

[11] 4,292,548
[45] Sep. 29, 1981

[54] DYNAMICALLY PROGRAMMABLE LOGIC CIRCUITS

[75] Inventors: Ricardo Suarez, Estado Miranda; Oscar Chang; Vladimir Adam, both of Caracas, all of Venezuela

[73] Assignee: Instituto Venezolano de Investigaciones Cientificas (IVIC), Venezuela

[21] Appl. No.: 62,233

[22] Filed: Jul. 27, 1979

[51] Int. Cl.³ .................. H03K 19/08; H03K 19/20
[52] U.S. Cl. ............................ 307/465; 307/468; 307/448
[58] Field of Search ................. 307/207, 214, 216

[56] References Cited

U.S. PATENT DOCUMENTS

| 3,145,342 | 8/1964 | Hill | 307/207 |
| 3,196,284 | 7/1965 | Hunter | 307/207 |
| 4,233,524 | 11/1980 | Burdick | 307/207 |

*Primary Examiner*—Harold A. Dixon
*Attorney, Agent, or Firm*—Browdy and Neimark

[57] ABSTRACT

A programmable logic circuit is formed by at least one gate. The gate is formed by four logic circuits, one being a first exclusive NOR circuit having a first input, a second input and an output. A second exclusive NOR circuit having a first input, a second input and output is provided, the first input of the second exclusive NOR circuit being coupled to the first input of said first exclusive NOR circuit. An AND circuit having a first input, a second input and an output is also provided. The first input of the AND circuit is coupled to the output of the first exclusive NOR circuit and the second input of the AND circuit means is coupled to the output of the second exclusive NOR circuit. A third exclusive NOR circuit having a first input circuit, a second input circuit and an output circuit is provided the first input circuit of the third exclusive NOR circuit is coupled to the output of the AND circuit. The gate can selectively function as an OR, NOR, AND and NAND circuit depending on ONE and ZERO signal levels applied to the respective second inputs of the second and the third exclusive NOR circuits as program variables. One of the variables is applied to the first input of the first exclusive NOR circuit and to the first input of the second exclusive NOR circuit, another variable being applied to the first input of the second exclusive NOR circuit. By connecting the second input of the second exclusive NOR circuit to one of the inputs of the first exclusive NOR circuit, the logic circuit will operate as an exclusive OR or exclusive NOR circuit.

17 Claims, 4 Drawing Figures

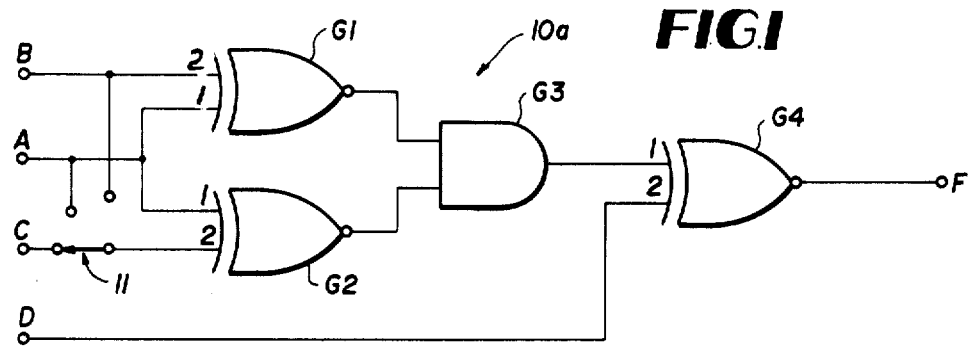

DYNAMICALLY PROGRAMMABLE LOGIC CIRCUITS

BACKGROUND OF THE INVENTION

This invention relates to programmable logic circuits which can perform a number of selectable logic functions. The invention is concerned with logic circuits which can dynamically be selectively programed to provide OR, NOR, AND and NAND functions and, if desired, exclusive OR (XOR) and exclusive NOR (XNOR) functions.

Logic circuits are currently used in many different types of apparatus, systems and in conjunction with other circuits. Logic circuits are used in and in conjunction with control circuits, calculators, computers, data processing systems and processors, to name a few uses. The more complex the systems, circuits or apparatus, the greater are the number and functional types of logic circuits generally required.

In many applications, a given logic circuit may be used for only a small portion of a time period during which a sequence of operations is being performed, remaining idle for considerable lengths of time. This results in uneconomical use of the logic circuits.

Moreover, in many applications a considerable number of logic functions must be performed, resulting in a need for numerous separate logic circuits. This results often in a large number of components. Such arrangements are often expensive to construct and can lead to relatively large space requirements.

SUMMARY OF THE INVENTION

It is an object of the present invention to provide a programmable logic circuit which can perform, under control of program variables, a number of logic functions, using the same components.

It is another object of the present invention to provide a programmable logic circuit which can perform a number of logic functions and is itself made of few components.

It is a further object of the present invention to provide a programmable logic circuit which, under the control of program variables, can function as an OR, NOR, AND or NAND circuit.

It is an additional object of the present invention to provide a programmable logic circuit which can be modified to function as an XOR circuit or an XNOR circuit.

It is yet another object of the present invention to provide a programmable logic circuit which can perform a number of logic functions, under the control of program variables, but is itself relatively simple and economical to construct and operate.

It is yet a further object of the present invention to provide a programmable logic circuit which can perform a number of logic functions, under the control of program variables and, nevertheless, is efficient in terms of space and time considerations.

The foregoing objects, as well as others which are to become clear from the text below, are achieved by a programmable logic circuit which is formed by at least one gate. The gate is formed by four logic circuits, one being a first exclusive NOR circuit having a first input, a second input and an output. A second exclusive NOR circuit having a first input, a second input and output is provided, the first input of the second exclusive NOR circuit being coupled to the first input of said first exclusive NOR circuit. An AND circuit having a first input, a second input and an output is also provided. The first input of the AND circuit is coupled to the output of the first exclusive NOR circuit and the second input of the AND circuit means is coupled to the output of the second exclusive NOR circuit. A third exclusive NOR circuit having a first input circuit, a second input circuit and an output circuit is provided the first input circuit of the third exclusive NOR circuit is coupled to the output of the AND circuit. The gate can selectively function as an OR, NOR, AND and NAND circuit depending on ONE and ZERO signal levels applied to the respective second inputs of the second and the third exclusive NOR circuits as program variables. One of the variables is applied to the first input of the first exclusive NOR circuit and to the first input of the second exclusive NOR circuit, another variable being applied to the first input of the second exclusive NOR circuit.

In one embodiment a plurality of the gates are provided, the gates individually being identically constructed.

At least some and, if desired, all of the gates of the plurality of gates may have one of their respective program variable inputs connected together.

In yet another variant, at least some and, if desired, all of the gates of the plurality of gates may have their two respective program variable inputs connected to corresponding inputs of those of the other gates which are to be controlled identically and simultaneously.

In one variant, the programmable logic circuit has the second input terminal of the second exclusive NOR circuit to the first input terminal of the first exclusive NOR circuit, the gate operating as an exclusive OR circuit or an exclusive NOR circuit depending on whether the program variable applied to the second input terminal of the third exclusive NOR circuit is a ONE or a ZERO. The connection can be made by a switch.

The logic circuit of the present invention in both its single gate and multigate forms is advantageously formed as a monolithic, integrated circuit.

BRIEF DESCRIPTION OF THE DRAWINGS

FIG. 1 is a diagram of a dynamically programmable logic circuit in accordance with an illustrative embodiment of the present invention.

FIG. 2 is a schematic circuit diagram of a preferred embodiment of a programmable preferred logic circuit in accordance with the present invention, the circuit including MOS realization thereof.

FIG. 3 is a schematic diagram of an XNOR circuit with associated drivers which can be used in practicing the present invention.

DETAILED DESCRIPTION OF THE PREFERRED EMBODIMENTS

Figure 4:
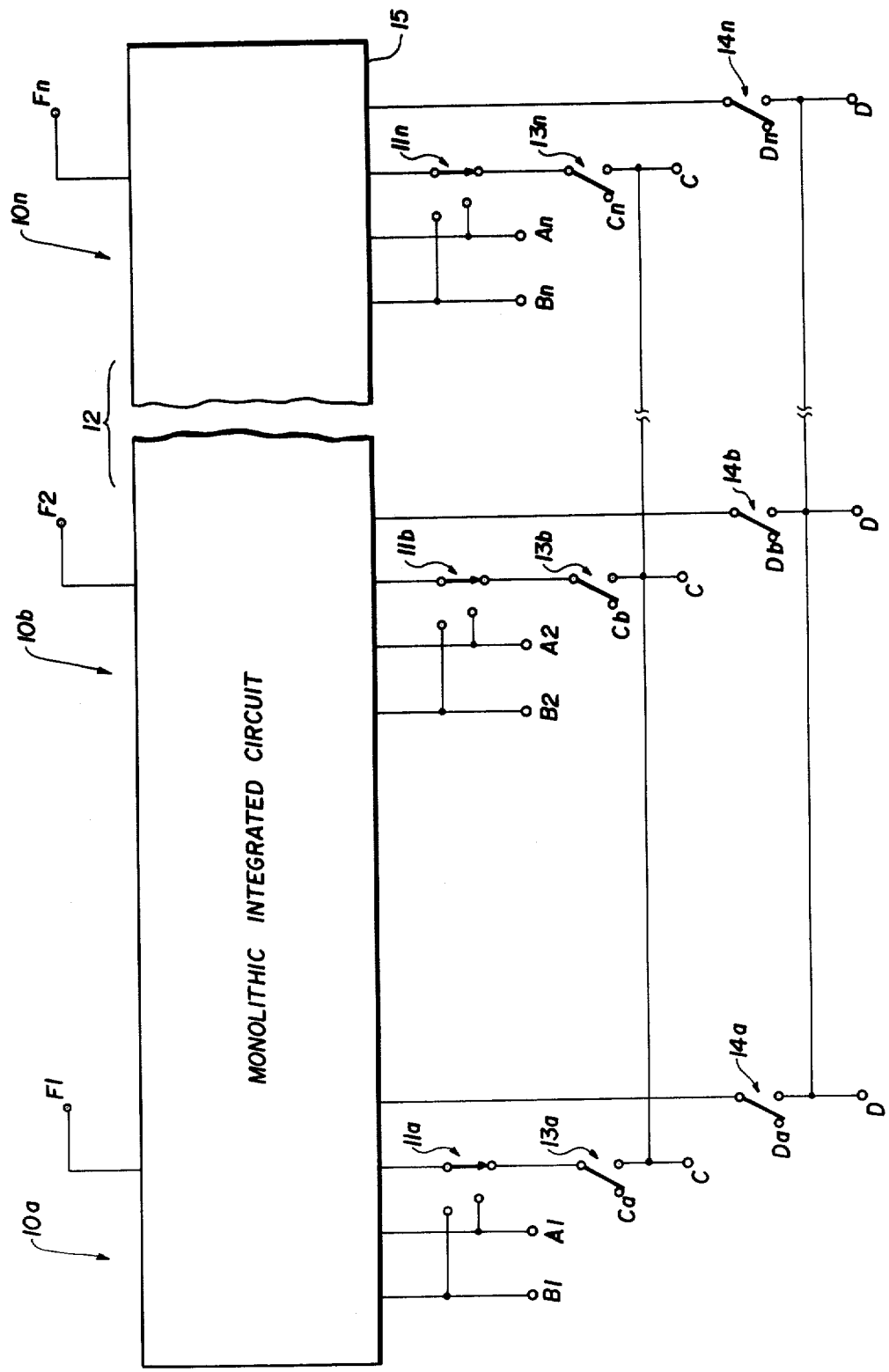
FIG. 4 is a somewhat diagramatic illustration of a monolithic, integrated circuit which includes a plurality of gates forming a preferred embodiment of the present invention.

A detailed description is of a logic circuit and specific embodiments thereof which can be dynamically programmed to perform the functions OR, NOR, AND, NAND, XOR and XNOR of two independent variables, by appropriate choice of the values of two additional controlling variables is set out below. Given two binary variables, A and B which can only take on the values ONE or ZERO, the functions performed by logic circuit are conventionally defined as follows:

$$OR: F(OR) = A + B = AB + \overline{A}B + A\overline{B} \quad (1)$$

$$NOR: F(NOR) = \overline{A + B} = \overline{A}\,\overline{B} \quad (2)$$

$$AND: F(AND) = AB \quad (3)$$

$$NAND: F(NAND) = \overline{AB} = \overline{A}\,\overline{B} + \overline{A}B + A\overline{B} \quad (4)$$

$$XOR: F(XOR) = A \oplus B = A\overline{B} + \overline{A}B \quad (5)$$

$$XNOR: F(XNOR) = \overline{A \oplus B} = \overline{A}\,\overline{B} + AB \quad (6)$$

The logic diagram of an exemplary, programmable logic circuit 10a as shown in FIG. 1 includes three component XNOR gates G1, G2 and G4 and an AND gate G3. The XNOR gates G1, G2 and G4 are respectively called the first, the second and the third XNOR circuits. A first input terminal of each of the first and the second XNOR gates is connected to an input terminal which is to receive the input variable A. The respective second input terminals of the first and second XNOR gates are respectively connected to terminals which are to receive the input variables B and C. The AND gate G3 has its two inputs connected respectively to the respective outputs from the first and the second XNOR circuits G1 and G2, its output terminal being connected to an input terminal of the third XNOR gate G4. The second input terminal of the third XNOR circuit G4 is connected to receive the input variable D. The digital output function denominated F appears at the output terminal from the third XNOR gate G4. The complete function implemented is:

$$F = \overline{(A \oplus B)} \, \overline{(A \oplus C)} \oplus D \quad (7)$$

$$= ABCD + AB\overline{C}\,\overline{D} + A\overline{B}\,\overline{D} + \overline{A}B\overline{D} + \overline{A}\,\overline{B}C\overline{D} \quad (8)$$

$$+ \overline{A}\,\overline{B}\,\overline{C}D.$$

where A, B, C, and D are binary variables. The input signals A and B are considered as independent variables, while input signals C and D are considered as control variables.

The different functions are obtained as follows:
For C=0, D=0, F becomes an OR function which can be expressed as:

$$F = AB + A\overline{B} + \overline{A}B = A + B \quad (9)$$

For C=0, D=1, F becomes a NOR function which can be expressed as:

$$F = \overline{A}\,\overline{B} \quad (10)$$

For C=1, D=0, F becomes a NAND function which can be expressed as:

$$F = \overline{A}\,\overline{B} + \overline{A}B + A\overline{B} = \overline{AB} \quad (11)$$

For C=1, D=1, F becomes an AND function which can be expressed as:

$$F = AB \quad (12)$$

For C=A or C=B, and D=0, F becomes an XOR function which can be expressed as:

$$F = A\overline{B} + \overline{A}B \quad (13)$$

For C=A or C=B and D=1, F becomes an XNOR function which can be expressed as:

$$F = \overline{A}\,\overline{B} + AB. \quad (14)$$

A preferred circuit implementation of the programmable logic circuit of FIG. 1 utilizing N channel Metal-Insulator-Semiconductor (MOS) technology is illustrated in FIG. 2. Unipolar transistors M1, M2 and M3 form the XNOR gate G1 of FIG. 1. Unipolar transistors M4, M5 and M3 make up the XNOR gate G2 of FIG. 1 and unipolar transistors M6, M7 and M8 form the XNOR gate G4 of FIG. 1. The AND gate G3 is implicity formed by the sharing of the transistor M3 between the XNOR gates G1 and G2.

The circuit as shown in FIG. 1 may include, if one wants to effect the XNOR and XNOR functions set out above in equations (13) and (14), a single-pole, triple-throw switch 11, shown directly connecting the second input of the second XNOR circuit G2 to receive the input variable C. In the position shown, the programmable logic circuit of FIG. 1 can perform the functions set out in equations (9)-(12), supra. The switch 11 can be placed in a second position in which the second input of the second XNOR circuit G2 is connected directly to receive instead of input variable C, the input variable A. The switch 11 can be placed in a third position in which the input variable B is fed, instead of the variables C or A, to the second input of the second XNOR circuit G2. In these positions the logic circuit functions respectively as an XOR or XNOR circuit as noted above.

The operation of a particular realization of an XNOR gate explained, which can be used in practicing the invention is reference being made to FIG. 3, where unipolar transistors Q1, Q2 and Q3 make up an XNOR gate. Unipolar transistor Q4, Q5, Q6 and Q7 form two inverter circuits which are used as drivers. The operation of the transistors is such that whenever there is a positive potential difference of sufficient magnitude, a logical ONE, between the gate terminal, say g1, and the source terminal, s1, there is current conduction from the drain, d1, to the source. The current flows through the transistor Q3, increasing the potential difference between terminals d3 and s3. As a consequence, the potential difference between the terminals d1 and s1 is reduced and the potential of a node (3), referred to ground potential, is reduced to a logical ZERO. Since the source terminal s1 of the transistor Q1 is connected to the gate terminal G2 of the transistor Q2, it is observed that whenever A is ONE and B is ZERO or viceversa, either the transistor Q1 or the transistor Q2 will conduct bringing the node (3) to a logical ZERO. On the other hand, if A=B (either ONE or ZERO), the potential difference between the gate and source terminals of the transistors Q1 and Q2 is negligible, and no conduction occurs. Under these circumstances the node (3) is at logical ONE. Therefore, the output of the XNOR gate is ZERO whenever A≠B and is ONE whenever A=B.

Referring to FIG. 4, a preferred embodiment of the present invention is shown diagramatically realized on a single chip, integrated circuit designated generally by the numeral 15. As shown in FIG. 4, the invention includes a plurality of gates $10_a$–$10_n$, the bracket 12 designating a portion of the chip 15 not shown for purposes of simplicity. It is to be understood that each of the gates $10_a$–$10_n$ are constructed as is the circuit of FIG. 1 so far as the three XNOR circuits and the AND circuit are concerned as shown in FIG. 1 for circuits G1, G2, G4 and G3, respectively.

Each of the gates $10_a$–$10_n$ is provided with a respective output terminal $F_1$–$F_n$. The terminal $F_1$ corresponds to the terminal shown as F in FIG. 1 and the switch $11_a$ corresponds to the switch 11 shown in FIG. 1 which has as its purpose the conversion of the gate $10_a$ to its XOR and XNOR functions. The gates $10_b$–$10_n$ are provided with corresponding switches $11_b$–$11_n$ which effect the same change of function for the gates $10_b$–$10_n$. Each of the single-pole, triple-throw switches $11_a$–$11_g$ are shown in positions which connect the second inputs of the second respective XNOR circuits, which corresponds to the XNOR circuit G2 of FIG. 1, to respective terminals which receive input variables $C_a$–$C_n$ which correspond to the input variable C shown in FIG. 1.

As illustrated in FIG. 4, each of the programmable logic circuits $10_a$–$10_n$ includes a respective single-pole, double-throw switch $13_a$–$13_n$ which, as shown, connect the respective second inputs of each of the second XNOR circuits to individual distinct sources of input variables $C_a$–$C_n$. The switches $13_a$–$13_n$ in their respective second positions connect these second inputs to a common source of input variable designated C. Accordingly, a number of the circuits $10_a$–$10_n$ can operate conjointly with respect to input variable C or, depending on the position of the individual switches $13_a$–$13_n$ from distinct, independent variables $C_a$–$C_n$.

In like fashion, each of the programmable logic circuits $10_a$–$10_n$ is also provided with a respective double-throw, single-pole switch $14_a$–$14_n$ which allows the second input of the third XNOR circuit, which corresponds to the XNOR circuit G4 of FIG. 1 to operate in conjunction with a respective given input variable $D_a$–$D_n$ in each case or a common input variable D.

The switches $11_a$–$11_n$, $13_a$–$13_n$ and $14_a$–$14_n$ as illustrated are shown as mechanical switches. It is to be understood that these switches could as well be electronic switches and could be switching gates, including semiconductive gates which could, if desired, be incorporated into and form a part of the integrated circuit 15. While the integrated circuit 15 as illustrated emcompasses a plurality of programed logic circuits $10_a$–$10_n$, it is to be understood that a single circuit, such as the circuit $10a$ shown in FIG. 1 could be realized as an integrated circuit and the more specific realization thereof could include the specific circuits of FIGS. 2 and 3, for example.

While the independent input variables $A_1$–$A_n$ and $B_1$–$B_n$ shown in FIG. 4 are independent, it is to be understood that variations could include additional switches which could supply given one or all of the independent variables $A_1$–$A_n$ and/or $B_1$–$B_n$ in common to the programmable logic circuits $10_a$–$10_n$ by incorporating switches like the switches $13_a$–$13_n$ and/or the switches $14_a$–$14_n$.

While the foregoing text and accompanying drawing figures relates to preferred, illustrated embodiments and variants, it is to be understood that there have been set out by way of illustration, not by way of limitation. Numerous other embodiments and variants are possible with the spirit and scope of the invention, its scope being defined by the appended claims.

What is claimed is:

1. A programmable logic circuit including at least one gate comprising:
    first exclusive NOR circuit means having first input means, second input means and output means;
    second exclusive NOR circuit means having first input means, second input means and output means, said first input means of said second exclusive NOR circuit means being coupled to said first input means of said first exclusive NOR circuit means;
    AND circuit means having first input means, second input means and output means, said first input means of said AND circuit means being coupled to said output means of said first exclusive NOR circuit means and said second input means of said AND circuit means being coupled to said output means of said second exclusive NOR circuit means; and
    third exclusive NOR circuit means having first input circuit means, second input circuit means and output circuit means, said first input circuit means of said third exclusive NOR circuit means being coupled to said output means of said AND circuit means;
    whereby the least one gate can selectively function as an OR, NOR, AND and NAND circuit depending on ONE and ZERO signal levels applied to the respective second input means of the second and the third exclusive NOR circuit means as program variables, with one independent variable being applied to the first input means of the first exclusive NOR circuit means and to the first input means of the second exclusive NOR circuit means, and another independent variable being applied to the second input means of the first exclusive NOR circuit means.

2. A programmable logic circuit according to claim 1, wherein the logic circuit is formed as a monolithic, integrated circuit.

3. A programmable logic circuit according to claim 1, wherein said at least one gate comprises a plurality of said gates.

4. A programmable logic circuit according to claim 3, wherein said plurality of gates is formed as a monolithic, integrated circuit.

5. A programmable logic circuit according to claim 3, wherein at least more than one of said gates of said plurality of gates have respective said second input means of their respective said second exclusive NOR circuit means coupled together to receive simultaneously one of the program variables.

6. A programmable logic circuit according to claim 3, wherein all of said gates of said plurality of gates have respective said second input means of their respective said second exclusive NOR circuit means coupled together to receive simultaneously one of the program variables.

7. A programmable logic circuit according to claim 3, wherein at least more than one of said gates of said plurality of gates have respective said second input means of their respective said third exclusive NOR circuit means coupled together to receive simultaneously one of the program variables.

8. A programmable logic circuit according to claim 3, wherein all of said gates of said plurality of gates have respective said second input means of said third exclusive NOR circuit means coupled together to receive simultaneously one of the program variables.

9. A programmable logic circuit according to claim 3, wherein at least more than one of said gates of said plurality of gates have respective said second input means of their respective said second exclusive NOR circuit means coupled together to receive simultaneously one of the program variables, and wherein at least more than one of said plurality of gates have respective said second input means of their respective said third exclusive NOR circuit means coupled together to receive simultaneously the other one of the program variables.

10. A programmable logic circuit according to claim 3, wherein all of said gates of said plurality of gates have respective said second input means of their respective said second exclusive NOR circuit means coupled together to receive simultaneously one of the program variables, and wherein all of said gates of said plurality of gates have respective said second input means of their respective said third exclusive NOR circuit means coupled together to receive simultaneously the other one of the programmable variables.

11. A programmable logic circuit according to claim 1, including means interconnecting said second input means of said second exclusive NOR circuit to said first input means of said first exclusive NOR circuit and to said first input means of said first exclusive OR circuit whereby the gate operates as an exclusive OR circuit or an exclusive NOR circuit depending on the program variable applied to the second input means of said third exclusive NOR circuit.

12. A programmable logic circuit according to claim 11, wherein said means for interconnecting includes switch means which selectively make and break the interconnection provided thereby.

13. A programmable logic circuit according to claim 1, including means interconnecting said second input means of said second exclusive NOR circuit to said second input means of said first exclusive NOR circuit whereby the gates operates as an exclusive OR circuit or an exclusive NOR circuit depending on the program variable applied to the second input means of said third exclusive NOR circuit.

14. A programmable logic circuit according to claim 13, wherein said means for interconnecting includes switch means which selectively make and break the interconnection provided thereby.

15. A programmable logic circuit according to claim 1, including means for selectively connecting said second input means of said second exclusive NOR circuit means alternatively to said first input means of said first exclusive NOR circuit means and to an independent source of a program variables.

16. A programmable logic circuit according to claim 1, including means for selectively connecting said second input means of said second exclusive NOR circuit means alternatively to said second input means of said first exclusive NOR circuit means and to an independent source of a program variable.

17. A programmable logic circuit according to claim 1, including means for selectively connecting one at a time to said first input means of said first exclusive NOR circuit means, said first input means of said second exclusive NOR circuit means and an independent source of program variable to said second input means of said third exclusive NOR circuit means.

* * * * *